United States Patent [19]

Barnes

[11] 4,087,705
[45] May 2, 1978

[54] HIGH POWER VARIABLE PULSE WIDTH TRIGGERING CIRCUITS

[75] Inventor: John A. Barnes, Stanton, Calif.

[73] Assignee: Ritter Corporation, Garden Grove, Calif.

[21] Appl. No.: 767,347

[22] Filed: Feb. 10, 1977

[51] Int. Cl.² .................. H03K 1/18; H03K 5/04
[52] U.S. Cl. .................. 307/265; 307/252 K; 328/65; 328/67; 328/58
[58] Field of Search .......... 307/265, 252 K; 328/65, 328/67, 230, 58

[56] References Cited

U.S. PATENT DOCUMENTS

| | | | |
|---|---|---|---|
| 3,424,925 | 1/1969 | Gagliardi et al. | 307/265 X |
| 3,435,249 | 3/1969 | Farrell | 307/265 X |
| 3,571,611 | 3/1971 | Robinson et al. | 328/67 X |
| 3,772,601 | 11/1973 | Smith | 328/65 |
| 3,928,809 | 12/1975 | Tschudi et al. | 307/265 |

Primary Examiner—John S. Heyman
Attorney, Agent, or Firm—Poms, Smith, Lande & Glenny

[57] ABSTRACT

The use of high voltage relays in variable pulse width magnetron type triggering circuits are avoided by the use of two separate pulse-forming networks. In addition, two separate banks of charging capacitors and switching transformers are employed. Separate SCR's are employed to apply charging current to either the first or the second bank of storage capacitors. Additional SCR's are employed to initiate the triggering sequence for the selected pulse-forming network and associated circuitry. The selected pulse length might be microsecond or one-quarter microsecond, with pulse repetition rates of 1,000 to 2,000 pulses per second. Accordingly, the duty cycle could be in the order of 0.001%, or less, but the output pulse power during the "on" time for the circuit might be in the order of several hundred kilowatts. During each cycle of operation, the two switching transformers and the output pulse transformer, which are both of the square or rectangular hysteresis loop type, are reset. Other special circuits are provided for preventing adverse interaction between the two high power pulse-forming networks and the circuitry associated with each of them.

10 Claims, 4 Drawing Figures

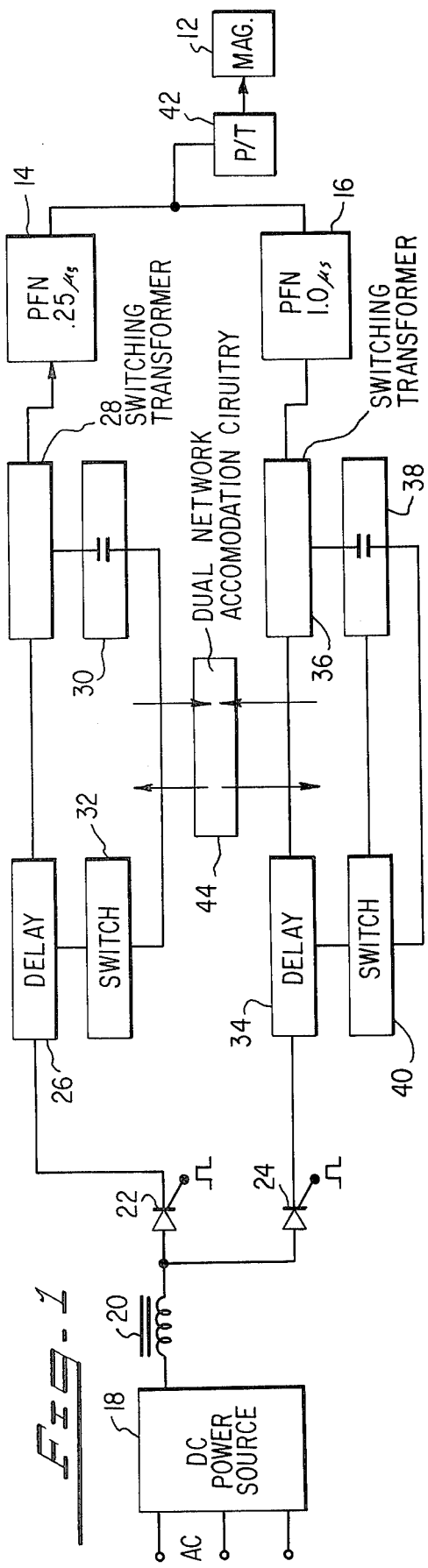
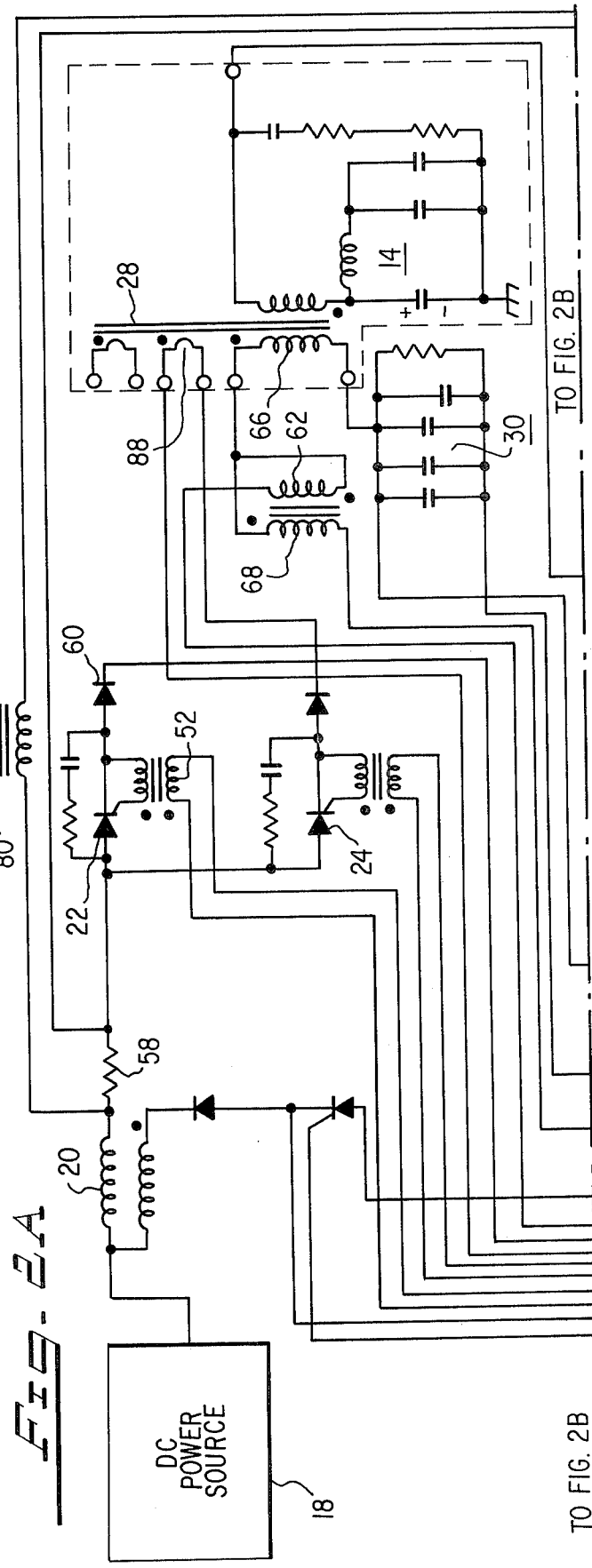
Fig. 1
Fig. 2A

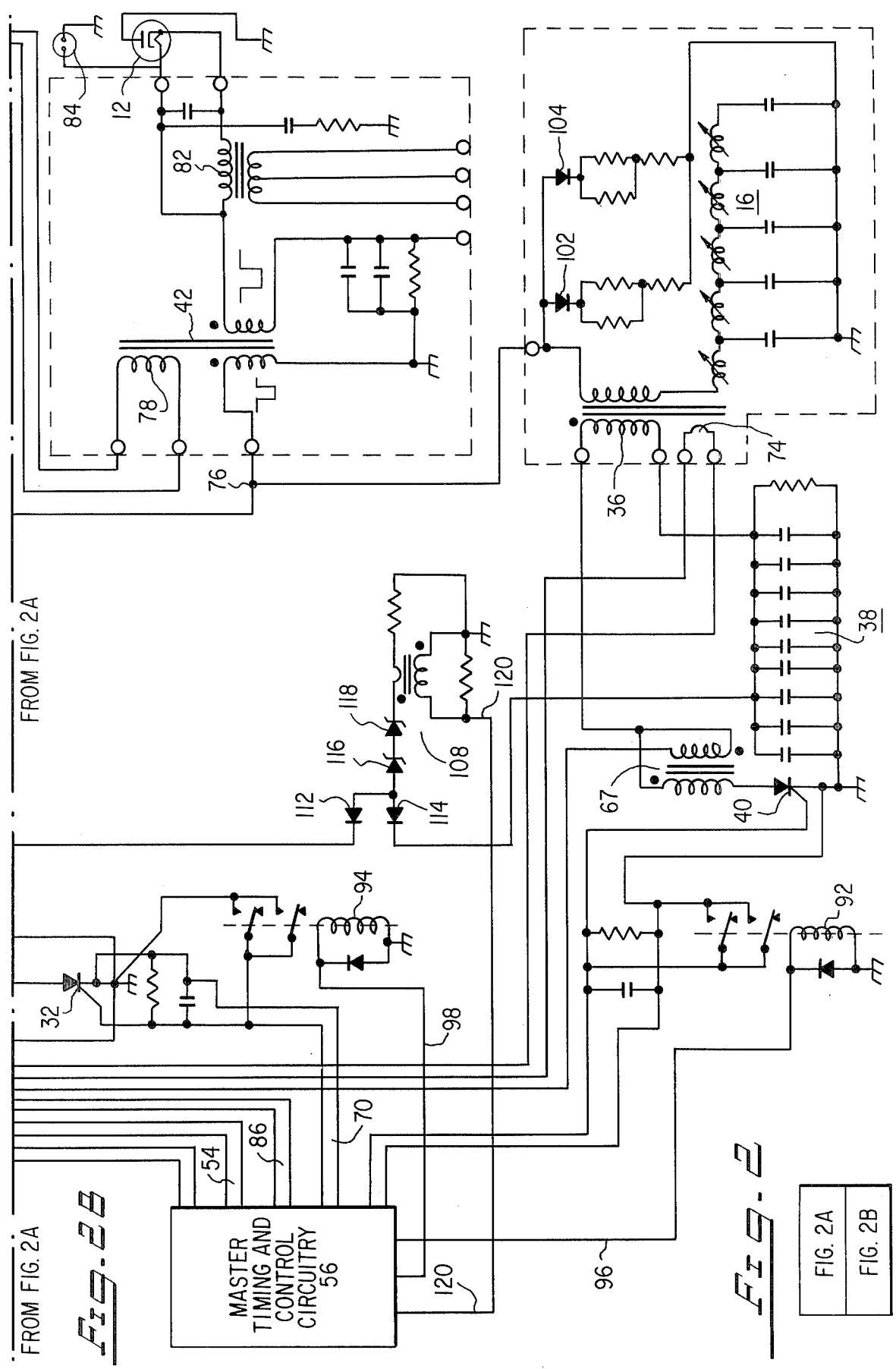

HIGH POWER VARIABLE PULSE WIDTH TRIGGERING CIRCUITS

FIELD OF THE INVENTION

This invention relates to pulse-forming networks for high power short duration applications such as magnetrons.

BACKGROUND OF THE INVENTION

When it is desired to provide a magnetron pulsing circuit which is capable of providing different length output pulses from the magnetron, it has previously been customary to use high voltage switching circuits. Thus, the pulse-forming network may be provided with several sections, with the entire pulse-forming network being employed for longer pulses, and only a portion of it being used for shorter duration pulses. The network is divided by a high voltage switching circuit, characteristically a high voltage vacuum relay, which may be selectively closed to permit the longer pulses using the full pulse-forming network, or opened to provide short duration pulses. Unfortunately, high voltage vacuum relays have a limited life expectancy, and their failure requires taking the pulse-forming network out of service while the relay is being replaced.

Accordingly, a principal object of the present invention is to provide a more reliable, variable length pulse-forming circuit, and more particularly one which does not require high voltage switching.

At the high power and high voltage levels which are involved in the present type of circuit, undesired interaction between alternate pulse forming networks feeding a common output pulse transformer and present serious difficulties. Accordingly, an additional object of the present invention is to avoid undesired interaction between two alternate pulse-forming networks which are coupled to single output pulse transformer for triggering a magnetron, or the like.

SUMMARY OF THE INVENTION

In accordance with the present invention the use of high voltage relays or switches in variable length pulse triggering circuits for magnetrons or the like is avoided, through the use of separate pulse-forming networks and associated switching transformers and charging circuits, which both feed a common output pulse transformer. Low voltage actuated SCR's are employed to direct charging current to one of the pulse forming networks or the other.

In accordance with one feature of the invention, on each cycle of operation the switching transformers in both pulse-forming networks are reset. In addition, the triggering SCR or the pulse circuit which is not in use is grounded to absolutely preclude false operation due to noise or other inductive pickup.

Advantages of the invention include increased reliability and much less need for maintenance. In addition, the expected undesired interaction, impairment of pulse shape, and amplitude modulation which would be expected with dual circuits, have been prevented in accordance with the present circuits.

other objects, features, and advantages of the present invention will become apparent from a consideration of the following detailed description and from the drawings.

BRIEF DESCRIPTION OF THE DRAWINGS

FIG. 1 is a block circuit diagram illustrating the principles of the present invention;

FIGS. 2A and 2B together make up a detailed circuit diagram showing the key circuits of FIG. 1 with a considerable specificity; and FIG. 2 shows the relationship of FIGS. 2A and 2B.

DETAILED DESCRIPTION

Referring more particularly to the drawing, FIG. 1 shows the overall circuit for energizing a magnetron 12 which appears to the right in FIG. 1. By way of specific example the pulse to be applied to the magnetron 12 might be in the order of 600 kolowatts or 25 amperes at approximately 23 kilovolts. The desired pulse repetition rate might be in the order of from 1,000 to 2,000 pulses per second, and the pulse length might be variable between two selected pulse lengths between perhaps one fifth of a microsecond, and 1 or 2 microseconds. For the purposes of the illustrative example of FIG. 1, it will be assumed that the pulse forming network 14 has an output pulse of about one fourth of a microsecond, while the pulse length provided by the alternate pulse-forming network 16 is approximately 1 microsecond.

In FIG. 1 the DC power source 18 is supplied with 3-phase alternating current input and has an output to the charging inductance 20 of approximately 250 volts DC. Charging current is selectively routed either to the short pulse-forming network in the upper path of FIG. 1 through SCR 22, or to the longer pulse-forming circuitry in the lower portion of FIG. 1 by the application of a pulse to SCR 24. The input to the pulse-forming network 14 is provided by the four circuits, including delay circuit 26, transformer 28, the bank of storage capacitors 30, and the switch 32. A similar set of four circuits 34, 36, 38 and 40 are associated with the pulse-forming network 16. The delay circuit 26 protects the SCR switch 32 against the premature application of large power levels. The bank of capacitors 30 is charged through delay circuit 26 and the reset winding of switching transformer 28. When a pulse is to be generated, the switch 32 is closed and the bank of capacitors 30 is discharged through the switching transformer 28. This energizes the pulse-forming network 14 which in turn applies a timed pulse to the output pulse transformer 42.

Alternatively, by charging capacitor 38 through the application of a low level energizing signal to SCR 24, a longer output pulse is provided to the magnetron 12.

The block 44 indicates schematically the "dual network accommodation circuitry". In this connection, it may be noted that others had abandoned the possibility of employing two separate pulse-forming networks because of the formidable obstacles presented by the reaction of one circuit on the other. In accordance with the present invention, these problems have been solved through the use of certain circuitry which will be described in detail in connection with FIG. 2, and which are for convenience indicated by the block 44 in FIG. 1.

With reference to FIG. 2, certain components which are shown in FIG. 1 also appear in FIG. 2, and these carry the same reference numerals. For example, in the upper left part of FIG. 2 the charging inductor 20 appears. In addition to the main upper winding of inductor 20 it also includes a so-called DE-Q-ING coil for regulation purposes. Other circuit components which appear in both FIGS. 1 and 2 include the two switching transformer 28 and 36, the two capacitor charging networks 30 and 38, the two pulse-forming networks 14 and 16, the output pulse transformer 42 and the magnetron 12. In addition, the SCR's 22, 24, 32, and 40 appear in FIG. 2 as well as in FIG. 1. Also of course, the DC power source 18 appears at the upper left in FIG. 2 supplying current to the charging inductor 20.

Now, turning to a consideration of the basic mode of operation of the circuit of FIG. 2, the application of a energization pulse to magnetron 14 from the shorter pulse-forming network 14 will now be considered. Initially, to start the application of charging current to the capacitor band 30, the SCR 22 is energized through the isolation transformer 52 by a control signal on leads 54 from the master timing and control circuitry 56. Current from the power source 18 passes through charging inductor 20, resistor 58, SCR 22, blocking diode 60 through the reset coil 62 of inductor 64, through winding 66 of switching transformer 28 to reset this transformer to the proper magnetization state, and finally to charge the capacitors included in charging circuit 30. Incidentally, the inductive circuit 64, as well as the two switching transformers 28 and 36, the output pulse transformer 42, and the other inductor 67, which corresponds in the other pulse-forming circuit to inductor 64, are all made using special metal core materials which give a rectangular hysteresis loop. As is known in pulse circuits for magnetrons of the present type, these cores are usually made of approximately 50% iron and 50% nickel, and have special rectangular hysteresis loop characteristics, so that they can either be switched from one state to the other when energized, or have substantially no output when they are already in the state to which they are being set.

In the present example, we are presuming that the magnetron is being energized with a series of short pulses through the use of the short pulse-forming network 14 and the associated charging circuit 30 and transformer 28. Accordingly, the passage of charging current through winding 66 is necessary to reset switching transformer 28 to its magnetization state in which it is capable of supplying a vigorous forward pulse to the pulse-forming network 14 when the capacitor bank 30 is discharged. The winding 68 on the inductive element 64 serves to delay the application of high levels of current to SCR 32 to protect it when it is being turned on. Again, the resetting action by the application of the charging current through winding 62 serves to set inductive element 64 to its proper state to delay the buildup of discharge current through SCR 32. Now, when SCR 32 is energized by the application of a pulse on leads 70 from the control circuit 56, capacitor bank 30 is discharged through primary winding 66 and an output pulse of considerable magnitude is applied to pulse-forming network 14.

Considering typical voltage levels which might be present at various points in the circuit of FIG. 2, it will be assumed that the power supply 18 supplies direct current at 250 volts. The charging inductor 20 is chosen for resonance with the capacitors 30 and therefore charges them up to approximately twice the 250 volt output level of power source 18. The switching transformer 28 has a step-up turns ratio of approximately 20:1. Accordingly, when the 500 volts from capacitor bank 30 is applied to switching transformer 28, approximately 10,000 volts appears at the secondary. In practice it is understood to be approximately 8.4 kilovolts. In accordance with known principles, approximately half of the 8.4 kilovolts appears at the primary of the pulse transformer 42 which has a step-up ratio of about 5 or 6 to 1. Accordingly, an output pulse of approximately 23 kilovolts is applied to the magnetron 12.

It may also be noted, by carefully tracing the circuit from diode 60 to the upper terminal of winding 62, that the reset winding 74 on transformer 36 in the other pulse-forming circuit is energized to ensure that it is in the proper state to present a high impedance at point 76.

The reset of output pulse transformer 42 is accomplished through reset coil 78 which is connected in parallel with resistor 58, and is included in the charging circuit for both capacitor banks 30 and 38. Incidentally, isolation coil 80 is provided in this reset circuit to block the transmission of high voltage back toward inductor 20.

Diverging a moment from the main thrust of the present description, it may be noted that, associated with the magnetron 12 is a conventional energization circuit for the cathode including filament transformer 82. Also, in parallel with the magnetron 12 is a spark gap 84 which prevents the generation of extremely high voltages which might otherwise occur if the magnetron fails to start conducting current.

Returning to the mainstream of the present description, when the longer pulse-forming network 16 is in operation, the mode or sequence of operation is much the same as has been described above in connection with the upper circuit; however, action is initiated by the application of a pulse to SCR 24 over leads 86 from control circuitry 56. This initiates charging of capacitor bank 38, meanwhile resetting switching transformer 28 through coil 88, and resetting switching transformer 36 and delay reactor 66; and also resetting the output pulse transformer 42 through reset coil 78 in the same manner as described above for the operation of the shorter pulse-forming network. The remainder of the operation of the longer pulse-forming network is substantially the same as described above except of course that the output pulse is four times as long.

Relays 92 and 94 which may be energized by signals or leads 96 and 98, respectively, make another important contribution to the compatibility of the two pulse-forming networks and circuits employed in the present system. More specifically, relay 92 positively grounds the control electrode of SCR 40 to ensure against false triggering due to noise and the like; and relay 94 performs a similar function relative to SCR 32 when the longer pulse-forming circuit is being utilized. More specifically, with voltage levels of the type which are present in the system of the invention, some charge will be developed on the capacitor bank even when it is supposedly not being charged. Then, upon pickup of noise and energization of the associated switching SCR 32 or 40, undesired modulation of the pulse provided by the other circuit will occur. Such undesired interaction of the two circuits has been one of the factors which has prevented the use of this type of circuit arrangement, up to the present time. By the use of both the cross-over resetting arrangements for the switching transformers to ensure a high impedance at junction point 76, and through the positive circuitry for grounding the switching SCR's, the difficulties which have heretofore precluded the use of two parallel pulse-forming networks have been overcome and a new circuit of high reliability which is relatively maintenance free has been achieved.

Incidentally, diodes 102, 104, which are connected to the common input point 76 to the primary of output pulse transformer 42 are provided to cut off the reverse polarity swing of the driving pulse to the output transformer. Also, it may be noted that the three dashed line blocks shown in FIG. 2 represent oil filled cans containing the indicated components.

The protective circuit 108 is provided to sense improper operation of the circuitry, such as the failure of the magnetron to fire. Under normal conditions the capacitor banks 30 and 38 are positive and the diodes 112 and 114 block such positive voltage from the protective circuit 108. However, if the voltage on either capacitor bank reaches a negative voltage, such as 50 volts, as determined by the pair of Zener diodes 116, 118, thus a pulse is transmitted over lead 120 to control circuit 56. The negative voltage on the capacitor bank could arise from an impedance mismatch at output transformer 42 if the magnetron 12 does not fire; and this mismatch produces a negative voltage at the pulse forming network 14, for example, and this is coupled by the switching transformer 28 to produce a negative voltage at the capacitor bank 30. Control circuitry 56 includes a counter circuit which counts successive warning signals from circuit 108, and, after a predetermined count is reached, disables the circuitry to protect the components.

It is to be understood that the other components shown in FIG. 2 but not specifically mentioned, are generally conventional and their purpose would be apparent to one skilled in the art. In this connection reference is made to two books which provide useful background information on this type of circuit; (1) *High Power Semiconductor — Magnetic Pulse Generators*, by G. T. Coate and L. R. Swain, Jr., 1966, The M.I.T. Press, Cambridge, Massachusetts; and (2) *Pulse Generators*, edited by G. N. Glasoe, and J. V. Lebacqz, 1948, Dover Publications, Inc., 180 Varick St., N.Y., N.Y. 10014.

In addition, it is understood that, in addition to the two circuits shown in the present FIG. 2, three pulse-forming circuits for providing pulses of different duration could be employed. Furthermore, the implementation of specific functions could be implemented by slightly different circuit components or arrangements in many instances, as will be appreciated by those skilled in the art.

I claim:

1. A high power low duty cycle pulse-forming system comprising:
   a DC power source;
   a charging inductor connected to said power source;
   first pulse-forming circuit means for producing pulses of a predetermined duration, including a first bank of capacitors, a first pulse-forming network, and a first switching transformer connected between said bank of charging capacitors and said pulse-forming network;
   second pulse-forming circuit means for producing pulses of a significantly different duration, including a second bank of capacitors, a second pulse-forming network and a second switching transformer connected between said second bank of capacitors and said second pulse-forming network;
   first and second SCR means for selectively connecting said inductor to said first or said second bank of capacitors to charge one of said banks of capacitors;
   third and fourth SCR means for selectively discharging either said first or said second bank of capacitors;
   common output pulse transformer means connected to receive pulses from the selected one of said first or second pulse forming circuits; and
   means coupled to said charging circuits for applying resetting pulses to both said first and said second switching transformers and to said output pulse transformer following each cycle of operation of said pulse forming system.

2. A system as defined in claim 1 further comprising:
   circuit means for selectively energizing either said third or fourth SCR means to discharge said first or second bank of capacitors to initiate a pulse of the desired duration; and
   additional circuit means for grounding the one of said third or fourth SCR means which was not energized to further preclude interaction between said first and said second pulse-forming circuits.

3. A system as defined in claim 1 further comprising:
   a delay switching inductor in series with each of said third and fourth SCR means; and
   means for resetting the delay inductor as the capacitor bank in the selected pulse forming circuit associated with said inductor is being charged.

4. A system as defined in claim 1 further comprising a magnetron connected to receive pulses from said output pulse transformer.

5. A high power low duty cycle pulse-forming system for magnetrons or the like comprising:
   a DC power source;
   a charging inductor connected to said power source;
   first pulse-forming circuit means for producing pulses of a predetermined duration, including a first bank of capacitors, a first pulse-forming network, and a first switching transformer connected between said bank of charging capacitors and said pulse-forming network;
   second pulse-forming circuit means for producing pulses of a significantly different duration, including a second bank of capacitor, a second pulse-forming network and a second switching transformer connected between said second bank of capacitors and said second pulse-forming network;
   first and second switching means for selectively connecting said inductor to said first or said second bank of capacitors to charge one of said banks of capacitors;
   third and fourth switching means for selectively discharging either said first or said second bank of capacitors;
   common output pulse transformer means connected to receive pulses from the selected one of said first or second pulse-forming circuits; and
   means coupled to said charging circuits for applying resetting pulses to both said first and said second switching transformers and to said output pulse transformer following each cycle of operation of said pulse forming system.

6. A system as defined in claim 5 further comprising:
   circuit means for selectively energizing either said third or fourth switching means to discharge said first or second bank of capacitors to initiate a pulse of the desired duration; and
   additional circuit means for grounding the one of said third or fourth switching means which was not energized to further preclude interaction between said first and said second pulse-forming circuits.

7. A system as defined in claim 5 further comprising:
a delay switching inductor in series with each of said third and fourth switching means; and
means for resetting the delay inductor as the capacitor bank in the selected pulse forming circuit associated with said inductor is being charged.

8. A system as defined in claim 5 further comprising: protection circuit means for sensing voltage polarity reversal from normal operating conditions on either of said first or second banks of capacitors, and for producing a warning signal.

9. A system as defined in claim 5 further comprising a magnetron connected to receive pulses for said output pulse transformer.

10. A system as defined in claim 7 wherein said two switching transformers, said output transformer, and said two delay inductors are all rectangular hysterisis loop type switching components.